United States Patent [19]

Toyokura et al.

[11] Patent Number: 4,609,903
[45] Date of Patent: Sep. 2, 1986

[54] THIN FILM RESISTOR FOR AN INTEGRATED CIRCUIT SEMICONDUCTOR DEVICE

[75] Inventors: Nobuo Toyokura, Kawasaki; Toyokazu Ohnishi, Isehara; Naoki Yokoyama, Atsugi, all of Japan

[73] Assignee: Fujitsu Limited, Kanagawa, Japan

[21] Appl. No.: 662,480

[22] Filed: Oct. 19, 1984

[30] Foreign Application Priority Data

Oct. 20, 1983 [JP] Japan .................. 58-196415

[51] Int. Cl.$^4$ .................. H01C 7/10; H01C 7/13
[52] U.S. Cl. .................. 338/22 SD; 338/22 R; 338/306; 252/512
[58] Field of Search .................. 338/22 SD, 9, 306–314, 338/334, 22 R; 252/512; 427/82, 93, 94; 156/646; 204/192 C

[56] References Cited

U.S. PATENT DOCUMENTS

| 3,876,912 | 4/1985 | Sanders .................. 338/309 X |
| 4,489,101 | 12/1984 | Shibata .................. 427/94 X |
| 4,495,218 | 1/1985 | Azuma et al. .................. 427/94 X |
| 4,498,953 | 2/1985 | Cook et al. .................. 156/646 |
| 4,510,178 | 4/1985 | Paulson et al. .................. 427/94 |
| 4,526,665 | 7/1985 | Tanielian et al. .................. 204/192 C |

OTHER PUBLICATIONS

Electronics, vol. 53, No. 1, 3rd Jan. 1980, New York, USA; R. Allan, "Thin–Film Devices on Silicon Chip Withstand up to 500 C", pp. 39–40.

Primary Examiner—Clarence L. Albritton
Assistant Examiner—M. M. Lateef
Attorney, Agent, or Firm—Armstrong, Nikaido, Marmelstein & Kubovcik

[57] ABSTRACT

A thin film resistor for use in microelectronic devices, the resistor having a resistive layer comprising silicon nitride ($Si_3N_4$) and refractory metals of tungsten and/or molybdenum. The features of the structure of the resistor is that the film comprises a silicon nitride layer and grains of metal and/or metal silicide, wherein the resistivity is determined mainly by the silicon nitride. Therefore, the total resistance of the resistor can be controlled by controlling the amount of the silicon nitride, thus providing a wide range of the resistivity of $10^{-3}$ to $10^9$ $\Omega$cm. Other characteristics such as immunity to the dopant contained in an adjacent doped layer, namely heat resistivity and low activation energy of the resistivity are verified by associated experiments.

9 Claims, 15 Drawing Figures

THIN FILM RESISTOR FOR AN INTEGRATED CIRCUIT SEMICONDUCTOR DEVICE

BACKGROUND OF THE INVENTION

This invention relates to a thin film resistor for microelectronic devices. Particularly, it relates to a thin film resistor formed in an semiconductor integrated circuit (IC) device, having a wide range of resistivity, low temperature dependency, and high thermal stability and which is easy to fabricate.

As microelectronics penetrate rapidly into various fields of the industry, semiconductor devices such as silicon semiconductor ICs are playing an increasingly important role. Although silicon ICs are dominant in the products at present, ICs of compound semiconductors such as gallium-arsenide (GaAs) semiconductors having a higher mobility of carriers are becoming popular because of their higher switching speed and lower power consumption. For both semiconductor products described above, higher packaging density is also required to improve their performance and to minimize the size of electronic devices where the ICs are used.

For a microelectronic device, particularly for an IC, resistors are important elements. Polycrystalline silicon (polysilicon) resistors are widely used for silicon ICs, while bulk resistors are used for compound semiconductor ICs. Usually such resistors are formed in a substrate of an IC together with other elements such as capacitors and transistors, but there are several limitations to the characteristics and fabricating conditions resulting in various problems which need to be solved.

For example, polysilicon resistors are employed for high resistive loads for static memory cell circuits and inverter logic circuits. These resistors have a high resistance such as 10 M$\Omega$ to 10 G$\Omega$, and have very small dimensions such as 2 $\mu$m wide, 3 $\mu$m long and 0.3 $\mu$m thick. Accordingly, the necessary resistivity is approximately $10^5$ to $10^6$ $\Omega$cm. Such a high resistivity of polysilicon is attained by controlling the dopant concentration. However, variation of the resistivity of the polysilicon is very sensitive to the variation of dopant concentration. If the phosphorus dopant concentration varies from $1 \times 10^{18}$ atm/cm$^3$ to $4 \times 10^{18}$ atm/cm$^3$, for instance, the resistivity increases sharply by $10^5$ times. This sharp change of resistivity with respect to dopant concentration provides a serious difficulty in controlling the specified value of the resistance. Generally, it is considered that the resisitivity of the polysilicon is composed of the bulk resistivity of crystalline grains, the actual resistivity of the grain boundaries and the space charge potential barriers. The above matters have heretofore been considered in a report, for example, on page 682, Vol.ED.29, No.4, APL 1982, IEEE Transactions on Electron Devices by Nicky Chau Chun Lu and others. The resistivity also depends on the grain size and grain boundary density of the polysilicon. However, controlling of the grain size during the crystal growth is difficult and further grain growth in subsequent heating processes at above 900° C. is unavoidable, resulting in a change of resistivity.

The polysilicon is easily influenced by the adjacent layers of the device. For instance, it is reported that in the case of a polysilicon layer covered with a silicon nitride (SI$_3$N$_4$) layer formed by a plasma depositing method, the resistivity of the polysilicon layer decreased to 1/1000 times by heating at 450° C. for 2 hours. It is considered that this is ascribed to the occurrence of fixed charges and the surface state of the interface between the polysilicon layer and the insulator (silicon nitride) layer.

Furthermore, if the surrounding area adjacent to a polysilicon region is heavily doped, the dopants contained in the region tend to diffuse into the polysilicon resistor. As a result, the marginal area of the polysilicon resistor along the boundary area is doped and looses its resistivity, leading to a reduction of the resistivity of the polysilicon resistor. Considering this reduction, the resistor should be designed to start with a higher resistivity, but this adversely affects the high density packing of the IC.

In addition, a precise patterning for forming resistors into a semiconductor substrate by a selective diffusion method is difficult. An ion implantation patterning can assure higher accuracy of the dimension of resistors, but this method can not be applied to a compound IC such as gallium-arsenide (GaAs) ICs, because the temperature of the subsequent heat treatment for the diffusion process is limited due to the high evaporation rate of the element material such as arsenic (As) and is not sufficient to activate dopants implanted, resulting in uncontrolled resistivity of resistors.

Particularly with compound semiconductor ICs, resistors for the ICs are formed in the substrate occupying the area on the substrate, thereby decreasing the packaging density.

In order to overcome the problem with polysilicon resistors as described above, heat resistive resistor materials have been developed. A typical one is "cermet" which is a mixture of oxide materials such as aluminum oxide (Al$_2$O$_3$), beryllium oxide (BeO) and zirconium oxide (ZrO$_2$) and metals such as iron (Fe), nickel (Ni), cobalt (Co), chrome (Cr), copper (Cu), etc. "Cermet" is a heat resistive resistor material which can stand heating at 1000° C. However, metals contained in "cermet", tend to react with oxygen to convert to a metal oxide. This makes it difficult to control the resistance of "cermet" resistors. Furthermore, in a compound semiconductor, "cermet" is not useful because of the temperature limitation in its heat treatment as described above.

Another heat resistive material for film resistors or discrete resistors is tantalum nitride (TaN) which is moisture proof and stable during its lifetime. Recently, an improved resistor of tantalum nitride was proposed in Japanese patent application, No. TOKU-KAI-SHO58-14501 (published on Jan. 27, 1983) by K. TANAKA, wherein a tantalum-silicon-nitrogen alloy layer, containing silicon (Si) of 20 to 80 atomic percent, was formed in an atmosphere including nitrogen (N$_2$) gas with partial pressure of $0.5 \times 10^{-5}$ to $8 \times 10^{-5}$ Torr. The material can be heated below 800° C. This resistor is substantially a nitrided tantalum silicide resistor having a relatively low range of resistivity from $4 \times 10^{-4}$ to $2 \times 10^{-2}$ $\Omega$cm. Accordingly, this is not suitable for silicon transistors.

SUMMARY OF THE INVENTION

It is an object of the present invention to provide a thin film resistor for semiconductor devices, which has a wide range of resistance value, suitable for silicon ICs and compound semiconductor ICs, the resistor having significant thermal stability and excellent reproducibility.

It is another object of the present invention to provide a thin film resistor for a silicon semiconductor device, which is immune from dopant diffusion from adjacent regions and sufficiently heat resistive during the fabricating process of the device.

It is still another object of the present invention to provide a thin film resistor for compound semiconductor devices which matches the fabricating process and can be formed overlaying other elements of the device to conserve the surface area of the substrate.

The objects described above are attained by a resistor developed according to the present invention. The resistor is a layer formed on a semiconductor substrate or other substrate and the resistor comprising a mixture of metal and/or its silicide and silicon nitride ($Si_3N_4$). In the resistor of the present invention, the metal silicide is not essential to the film resistor. The metal and metal silicide provide the resistor with conductivity. The metal silicide is formed unintentionally in the fabrication process of the resistor. The metal is selected from elements such as molybdenum (Mo), tungsten (W), titanium (Ti), etc. and their silicide.

The resistive material of the resistor according to the present invention is studied with the aid of physical measuring methods such as XPS (X ray photo-spectroscopy), RBS (Rutherford back scattering) and X-ray diffraction. As a result, it was found that the structure of the material is a mixed structure of silicon nitride ($Si_3N_4$) and metal and/or its silicide. As the resistivity of the metal such as tungsten (W) is approximately only one-tenth of the silicide of the metal such as tungsten silicide ($WSi_2$), the total resistivity of the material depends mainly on the composition of silicon nitride ($Si_3N_4$), whose resistivity is significantly higher than that of the metal or the silicide of the metal by over ten orders. The grain boundary density also has some influence on the total resistivity of the material, because the electric barriers on the boundary suppress the movement of carriers. Therefore the resistivity is controlled by controlling the composition of silicon nitride ($Si_3N_4$) and grain size of the metal.

The resistive layer for the resistors is formed most effectively by a reactive sputtering method performed in an atmosphere including nitrogen ($N_2$) gas of a suitable partial pressure. The relation between the formation of silicon nitride ($Si_3N_4$) and the partial pressure of the nitrogen ($N_2$) gas has been examined carefully with the XPS method. It was found with the nitrogen gas having a partial gas pressure below around $10^{-4}$ Torr, that silicon nitride was not detected in the structure of the resistive material. On the other hand, the partial pressure of approximately $1 \times 10^{-4}$ to $5 \times 10^{-2}$ Torr was most suitable for a stable reactive sputtering process. As a conclusion, the nitrogen gas pressure described above is primarily used for embodiments of the present invention which will be described later.

The selection of the ratio of the metal to silicon nitride ($Si_3N_4$) is performed by selecting suitable targets and ion accelerating energy in the reactive sputtering process. One method is the selection of the area-ratio of targets of the metal, tungsten (W) for example, and of silicon. The controlling of the ion accelerating energy also provides the equivalent effect for the selection of the material ratio of the resistor to be formed. In mass production, a target of mixed material of metal and silicon such as a mixture of powdered material of metal and silicon with a specified ratio is effective.

As described above, by selecting a suitable ratio of sputtering of metal and silicon, a resistive material comprising a mixture of metal and silicon nitride having a significantly wide range of the resistivity from $10^{-3}$ to $10^9$ $\Omega$cm is obtained.

Considering the application of the thin film resistor of this invention to ICs, the diffusion behavior of dopants, phosphorus dopants for example, contained inside the resistor was studied. The mobility of dopants in the resistor material was found extremely small, suggesting that the resistor used in ICs is immune from the intrusion of dopants contained in an adjacent doped region at high temperature. Accordingly, the value of the resistivity of the resistor is maintained stable through the fabricating process and duration time.

In addition, the thin film resistor of the present invention is highly heat resistive and thermally stable, and the activation energy of the resistivity of the film resistor was found lower than that of a conventional polysilicon resistor by 1/2.5 times. These features are verified by associated experiments.

DESCRIPTION OF PREFERRED EMBODIMENTS

As described before, the resistive material of the resistor according to the present invention is a mixture of silicon nitride ($Si_3N_4$) and metal such as molybdenum (Mo) and tungsten (W) and/or their silicide. By controlling the mixing ratio of these elements, a wide range from $10^{-3}$ to $10^9$ $\Omega$cm of resistance value is attainable. The resistor and its fabricating method will be discloed together with associated experimental results.

Figure 1:
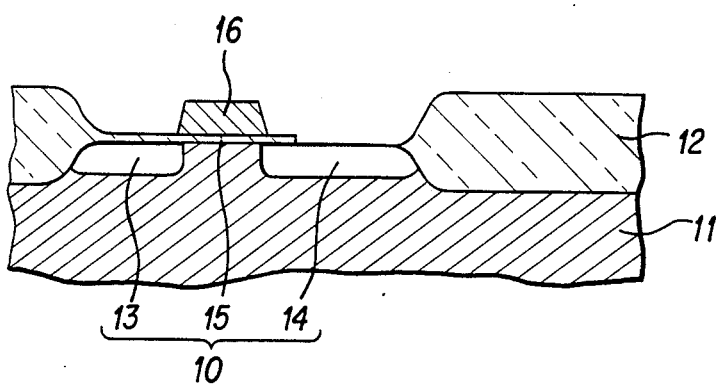
FIG. 1 is a cross-sectional view of an IC substrate having an FET and a resistor according to the present invention, illustrating the structure before the formation of the thin film resistor.
Figure 2:
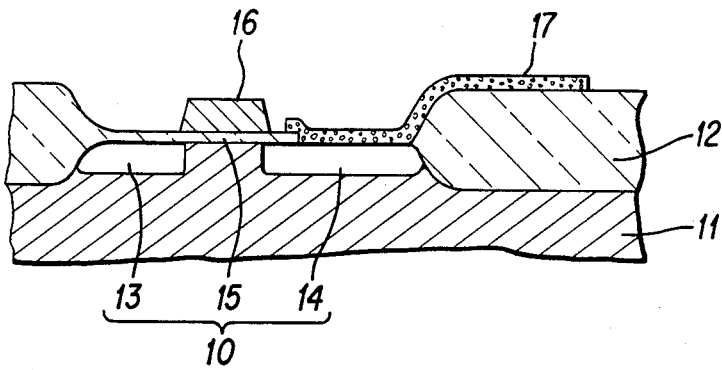
FIG. 2 is a cross-sectional view of the same IC shown in FIG. 1, illustrating the structure after the resistor is formed on the substrate.
Figure 3:
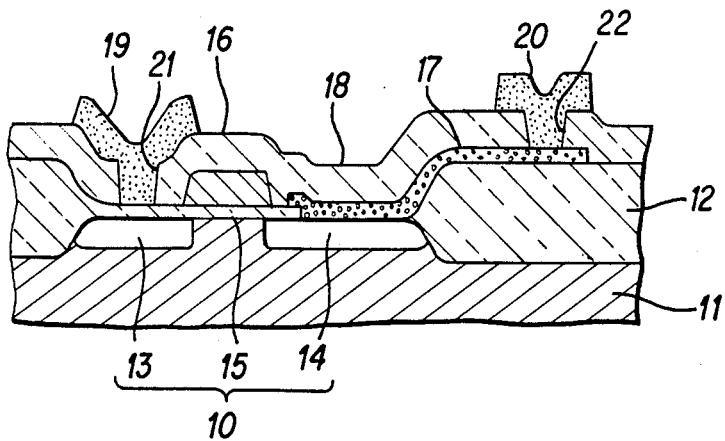
FIG. 3 is a cross-sectional view of an IC substrate having an FET and a thin film resistor according to the present invention, illustrating the finished structure.

Drawings of FIG. 1 to FIG. 3 are cross-sectional views of an IC at its respective fabrication steps illustrating a fabricating method of the resistor built in the IC. The cross-sectional view in the figures contain an MOS FET 10 (metal-oxide-semiconductor field effect transistor) formed in a transistor region defined by field oxide layers 12 in a silicon substrate 11. The FET comprises a source region 13, drain region 14, gate insulating film 15 and a gate electrode 16. A resistor according to the present invention is formed in this device.

In this embodiment, tungsten and silicon is used for the material for the sputtering target. Tungsten powders and silicon powders are mixed with a predetermined mixing ratio, and hot pressed to form a target for reactive sputtering, wherein the target is sputtered by the bombardment of nitrogen and argon ions. The partial pressure of the nitrogen ($N_2$) gas is selected from $1\times10^{-4}$ to $5\times10^{-2}$ Torr. The sputtered tungsten (W) and silicon (Si) react with nitrogen and form a resistive film layer of 0.3 $\mu$m thick covering the entire surface of the silicon substrate 11. In this case, if the substrate 11 is heated at approximately at 500° C. in advance, the resistivity of the resistive layer will be stable during the following heat treatments. The layer is patterned to form a resistor 17 by conventional photo-lithographic technology as shown in FIG. 2. After that, a insulator layer 18 is formed and a metal (aluminum) wiring 19 for ground (Vss) and another wiring 20 for a power source (Vdd) are formed on the insulator layer 18. Both wirings are connected to the source region 13 and the resistor 17 respectively, through respective contact hole 21 and 22 in the insulator layer 18. Unlike a prior art polysilicon resistor, the resistor 17 does not form a parasitic MOS device and thus provides a stable and reproducible resistor.

The structure of the resistor 17 was analyzed physically with the aid of various physical analyzing methods such as X-ray diffraction, X-ray photo-spectroscopy and Rutherford back scattering. As a result, the structure of the resistive layer was found to be a mixture, wherein grains of tungsten or tungsten plus tungsten silicide were distributed in the silicon nitride ($Si_3N_4$) formed during the reactive sputtering by the reaction between nitrogen and silicon. This structure is denoted as $W_x(Si_3N_4)_{1-x}$. But this does not mean that $W_x(Si_3N_4)_{1-x}$ is a chemical compound as a whole.

Figure 4:
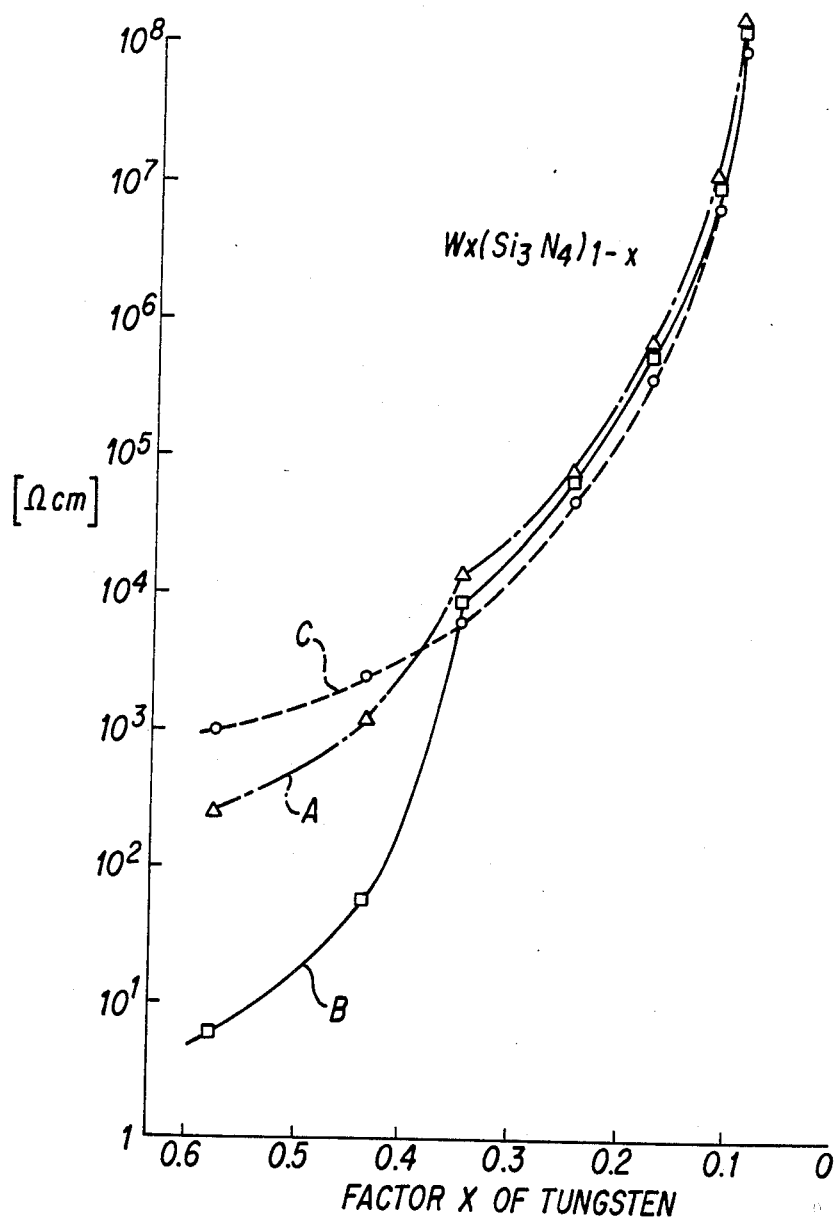
FIG. 4 illustrates graphically the relation between the resistivity and the ratio x of tungsten (W) in the thin film resistor material designated as $W_x(Si_3N_4)_{1-x}$ under various heat treatment conditions.

Generally, heat resistivity is an important factor for a resistor formed in a semiconductor device (IC), because the resistor formed is subject to several heat treatment processes such as a diffusion process during the subsequent fabricating process of the IC. The resistor of the present invention was found to have excellent heat stability. After a heat treatment at 1000° C. of the resistor, little change was found in the composition and binding energy. The results of associated experiments are illustrated in FIG. 4. In the figure, the resistivity of the resistor denoted as $W_x(Si_3N_4)_{1-x}$ is plotted against the composition factor x. Curve A (dash-dot line) shows the value immediately after the formation of the resistor, curve B shows the value after a heat treatment at 800° C. for 20 minutes, and curve C shows the resitivity of the resistor after a heat treatment at 1000° C. As clearly seen from the figure, above three curves coincide each other with regard to the mixing factor x below 0.35, which means the resistor is sufficiently heat resistive.

Figure 5:
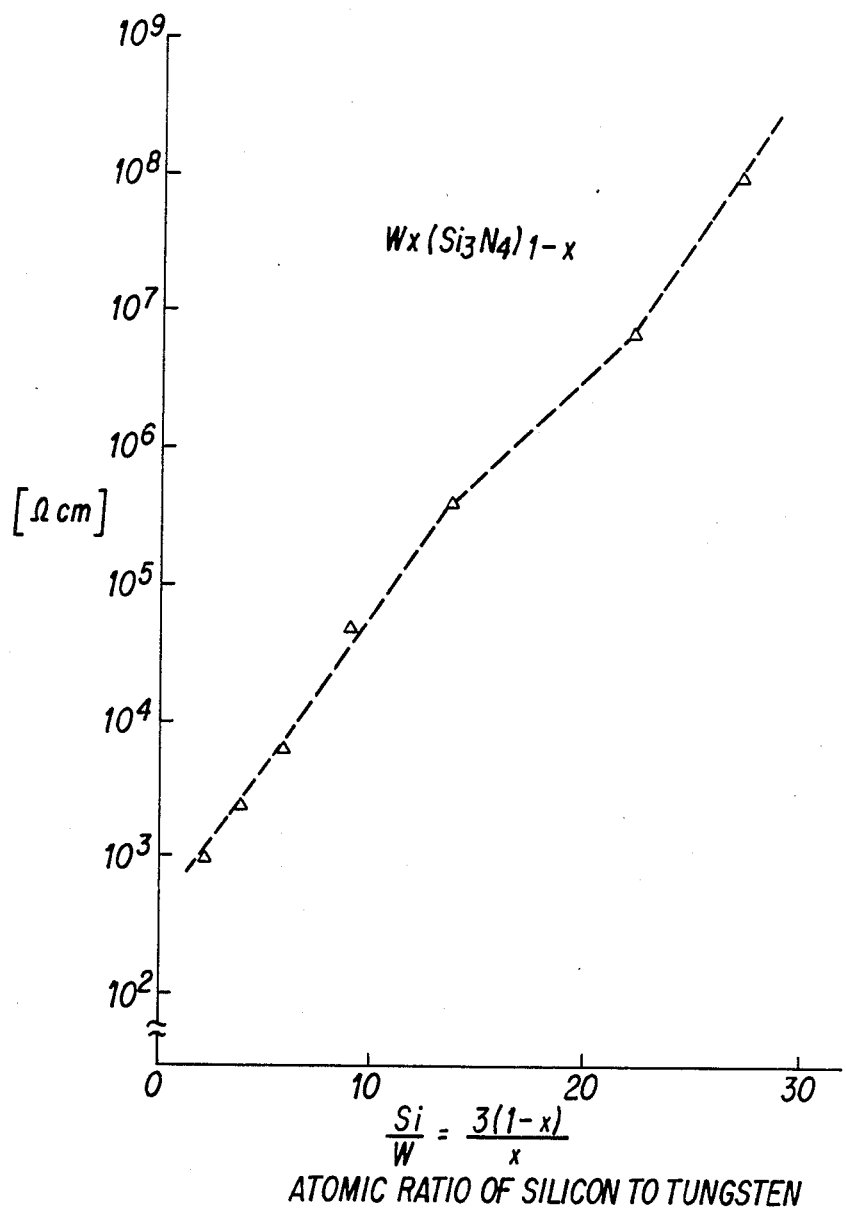
FIG. 5 illustrates graphically the relation between the resistivity and the atomic ratio $Si/W=3(1-x)/x$ in the thin film resistor material designated as $W_x(Si_3N_4)_{1-x}$.

The observed result denoted by the curve C is reploted against an atomic ratio Si to W in the abscissa as shown in FIG. 5. The obtained value is substantially aligned with a straight line. This implies that it is easy to control the resistivity of resistors and the resistivity can be varied from a wide range of 10 to $10^8$ $\Omega$cm. This expands the field for application of the resistors by this invention.

Particularly, for the value of x less than approximately 0.35, the heat treatment at 800° C. and 1000° C. provides almost the same resistivity. This shows a high thermal stability of the resistor, thus providing easy reproducibility in the fabrication. Such a thermal stability is considered to be ascribed to the structure of the resistive layer. In this case, the model of the structure is believed to be grains of tungsten or tungsten plus tungsten silicide, surrounded by silicon nitride ($Si_3N_4$), which prevents the movement and grain growth of the tungsten grains at high temperature. The silicon nitride layer ($Si_3N_4$) also prevent the intrusion of impurities into the resistive material and reduces the influence of a reductive atmosphere such as hydrogen ($H_2$) in the heat treatment furnance.

The resistivity of tungsten silicide is higher than that of tungsten (W) by one order, while the resistivity of silicon nitride ($Si_3N_4$) is immensely higher than that of tungsten or tungsten silicide by the order of nine to ten ($10^9$ to $10^{10}$). Accordingly, the total resisitivity of the resistor depends mainly on that of the silicon nitride and can be controlled by the distance between the tungsten grains. Apparently, the metal silicide is not essential for the thin film resistor of the present invention. The metal silicide is generated unintentionally during the reactive sputtering process for forming the resistive layer.

Figure 6:
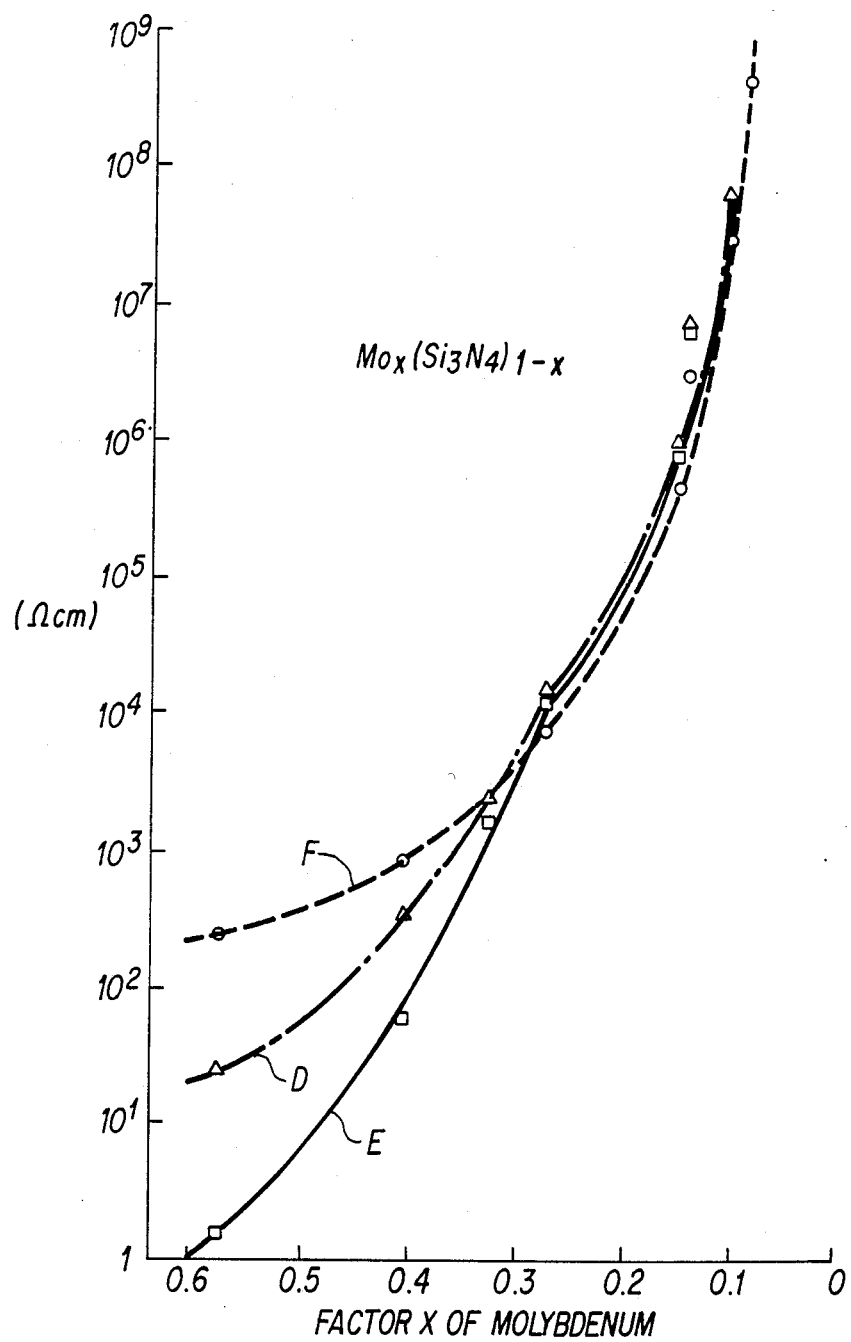
FIG. 6 illustrates graphically the relation between the resistivity and the ratio of molybdenum (Mo) for the thin film resistor material designated as $Mo_x(Si_3N_4)_{1-x}$ under various heat treatment conditions.
Figure 7:
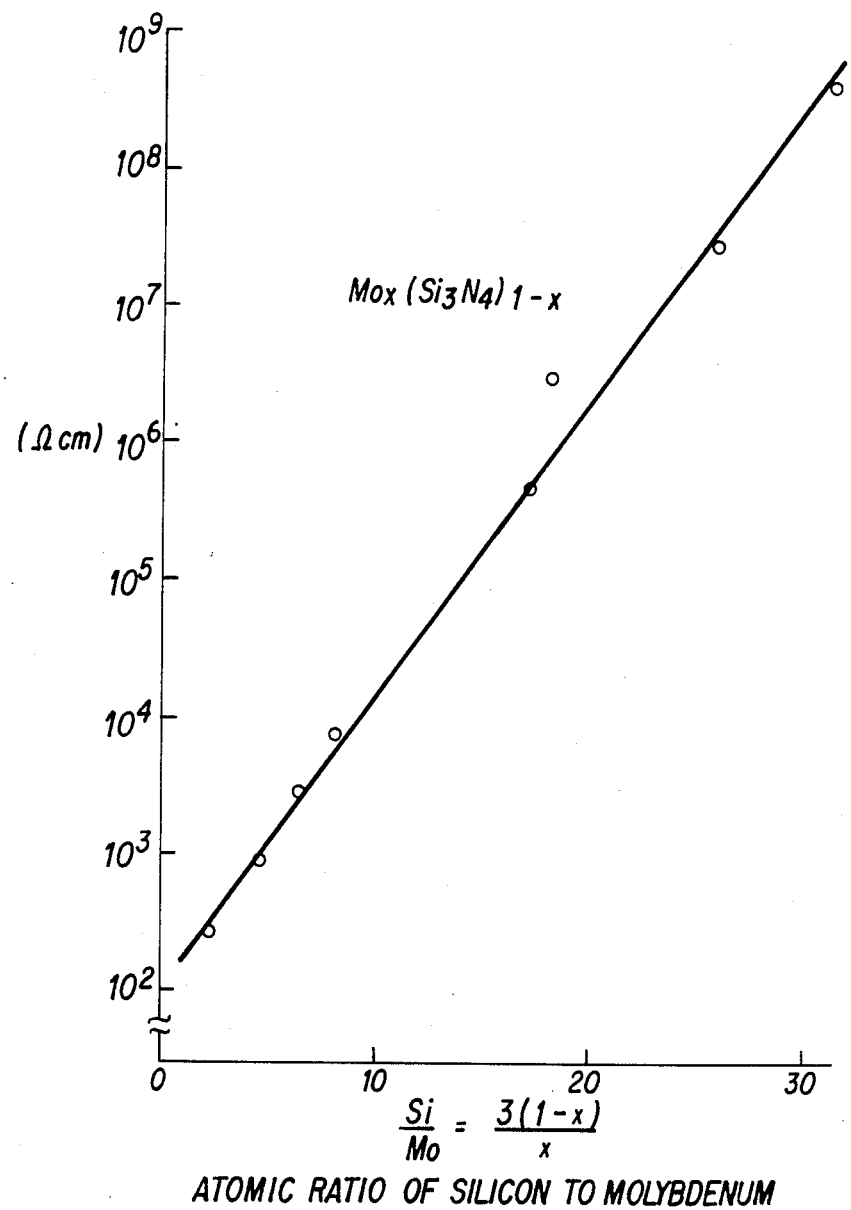
FIG. 7 illustrates graphically the relation between the resistivity and the atomic ration $Si/Mo=3(1-x)/x$ of the thin film resistor materal designated as $Mo_x(Si_3N_4)_{1-x}$ under various heat treatment conditions.
Figure 8A:
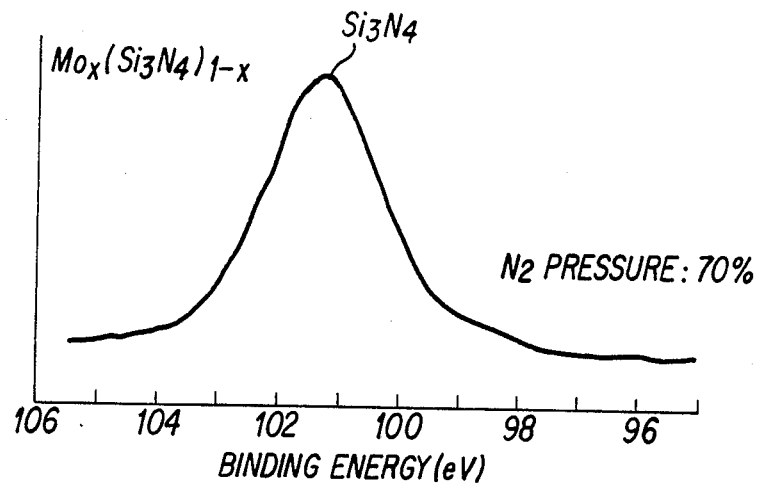
FIGS. 8(a) to (d) are the measurement results obtained by a X-ray photo-spectroscopy (XPS) method, illustrating the composition of the resistive material.
Figure 8B:
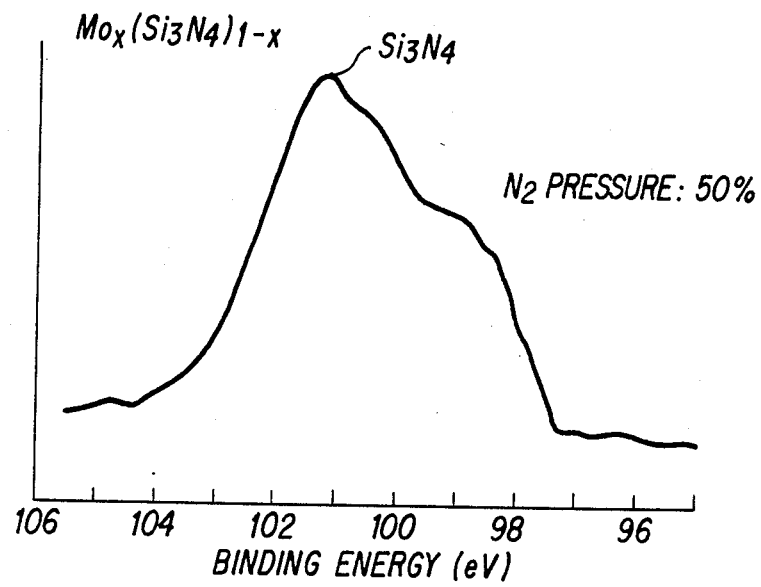
Figure 8C:
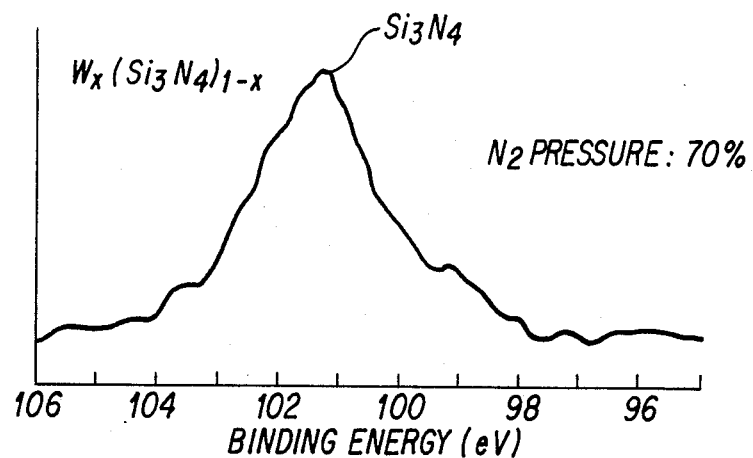
Figure 8D:
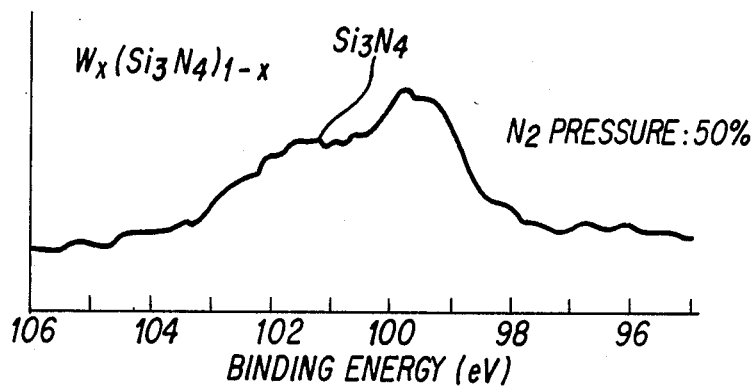

Similar results were obtained using molybdenum (Mo) as a second embodiment as illustrated in FIGS. 6 and 7. The resistive material is express by $Mo_x(Si_3N_4)_{1-x}$. FIG. 6 illustrates the relation between the resistivity of the resistor plotted on the ordinate and the composition x plotted on the abscissa. In the figure, curve D is plotted for the resistor immediately after its formation, curve E is for the resistor after a heat treatment at 800° C. and curve F is for the resistor after a heat treatment at 1000° C. The results demonstrated by the curve F in FIG. 6 is plotted again in FIG. 7, where the atomic ratio of silicon to molybdenum $Si/Mo=3(1-x)/x$ is taken on the abscissa. The results are similar to those shown in FIG. 5 which utilize tungsten (W), while the resistivity range of $10^2$ to $10^9$ $\Omega$cm is higher by one order than in the preceding embodiment.

The most remarkable feature of the structure of a resistor according to the present invention is the formation of silicon nitride ($Si_3N_4$) by the reactive sputtering. This formation was proved experimentally by an X-ray photo-spectroscopy (XPS) method with regard to $W_x(Si_3N_4)_{1-x}$ and $Mo_x(si_3N_4)_{1-x}$ layers. The silicon nitride ($Si_3N_4$) was formed during the reactive sputtering method. The atmosphere of the sputtering was a gas mixture of argon (Ar) and nitrogen ($N_2$). The partial gas pressure of the nitrogen was selected from 50% and 70% of the total gas pressure fixed at $10^{-3}$ Torr. The results observed by the X-ray photo-spectroscopy (XPS) method are illustrated in FIGS. 8(a) to (d). The counts are plotted on the ordinate and the binding energy in eV is plotted on teh abscissa. Material and the nitrogen gas pressure are indicated in the figures respectively. The value of the binding energy where the peak of the curves appear, indicate clearly the presence of silicon nitride ($Si_3N_4$) for every case.

Figure 9:
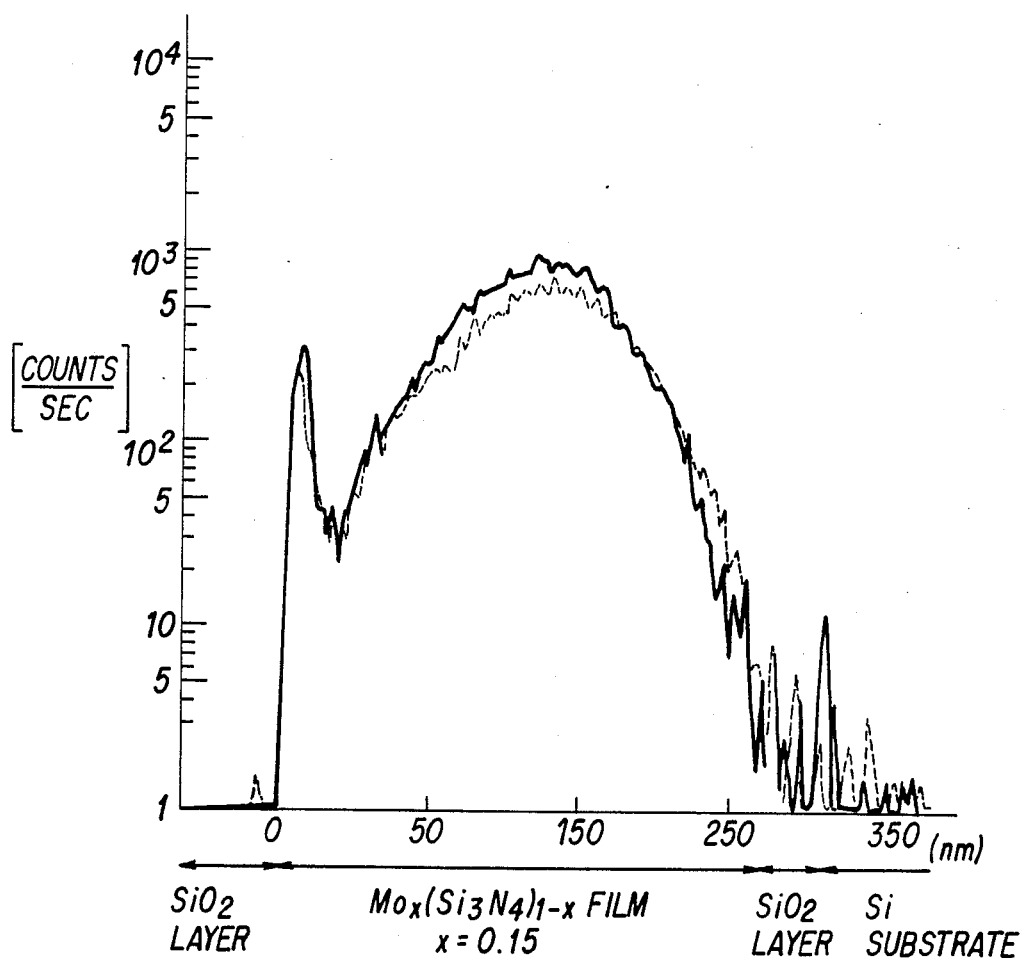
FIG. 9 illustrates graphically the phosphorus dopant distribution in the vertical (depth) direction in the resistive material layer.

As described before, the polysilicon resistors of the prior art are easily influenced by dopants contained in adjacent doped silicon regions. On the contrary, the resistor of the present invention is immune from the dopants usually used in ICs. This is verified by a following experiment. A probe of resistive material designated by a formula $Mo_x(Si_3N_4)_{1-x}$ where x is taken as 0.15 is prepared. Phosphorus (P) is implanted with a dose of $2 \times 10^{15}$ atm/cm$^2$ at an accelerating energy of 100 KeV and covered with a silicon dioxide ($SiO_2$) layer and heated in a nitrogen atmosphere in a furnace at 1000° C. for 30 minutes. The distribution of dopant (P) concentration in the probe before and after the heat treatment are measured using a SIMS (secondary ion mass-spectroscopy) method. The results are illustrated graphically in FIG. 9. The depth from the surface of the surface of the probe is taken on the abscissa. The composition of the probe is designated under the abscissa. The point corresponding to the depth equal to 0 $\eta$m is the surface of the resistive layer. The solid line shows the distribution of P dopants before the heat treatment and the dotted line shows that after the heat treatment. Apparently both curves coincide closely indicating that the mobility of the phoshporus dopant in the resistive material significantly small. The same experiments for studying the behavior of other type dopants, arsenic (As) and boron (B) were conducted proving that these dopants also have small mobility in the resistive material according to the present invention. As a conclusion, the resistor is quite immune from the influence of dopants conventionally used in ICs.

Figure 10:
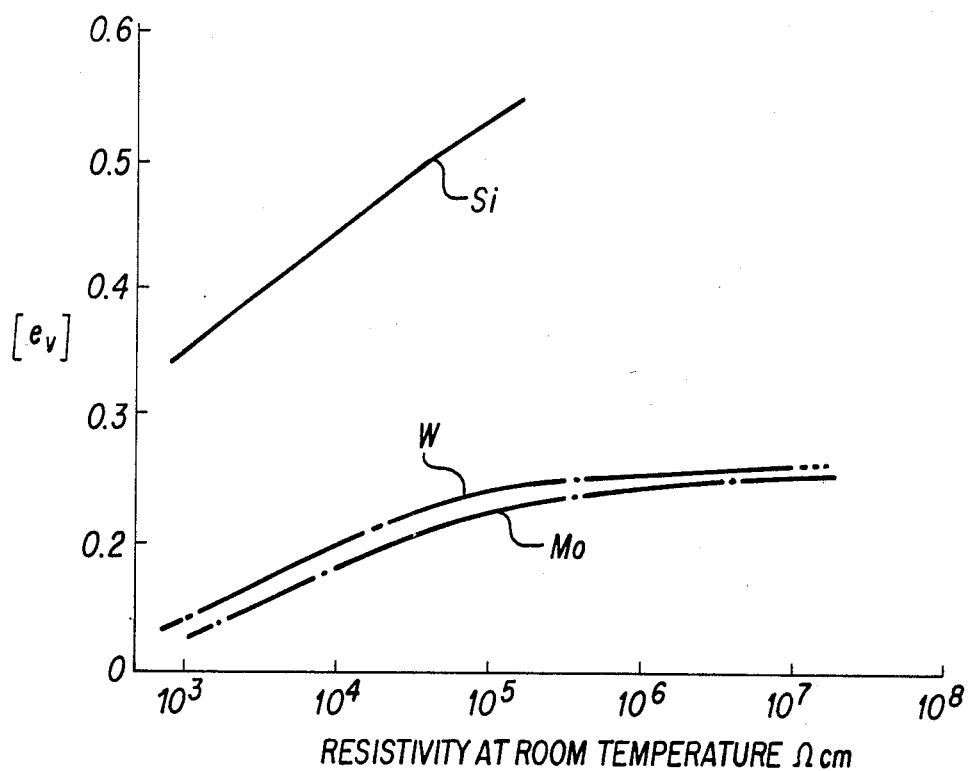
FIG. 10 illustrates graphically the relation between the activation energy and the resistivity at room temperature of the resistors according to the present invention containing tungsten and molybdenum as the respective component, compared with that of a polysilicon material.

Finally, in order to examine the temperature dependency of the resistor of the present invention, the activation energy for the resistivity was measured by a conventional technique. The results are plotted in FIG. 10, wherein the activation energy in eV is plotted on the ordinate and the resistivity at room temperature is plotted on the abscissa. Curves signified with W and Mo respectively show the activation energy of $W_x(Si_3N_4)_{1-x}$ and $Mo_x(Si_3N_4)_{1-x}$. A curve signified by Si shows the activation energy of polysilicon referred from the report recited on page 2 of this specification. From these curves, the activaation energy of the resistivity of the resistor by this invention is approximately 40% of that of polysilicon. This smaller temperature dependency of the resistivity of the resistor enhances the freedom of the thermal design of the IC wherein the resistor is employed.

Figure 11:
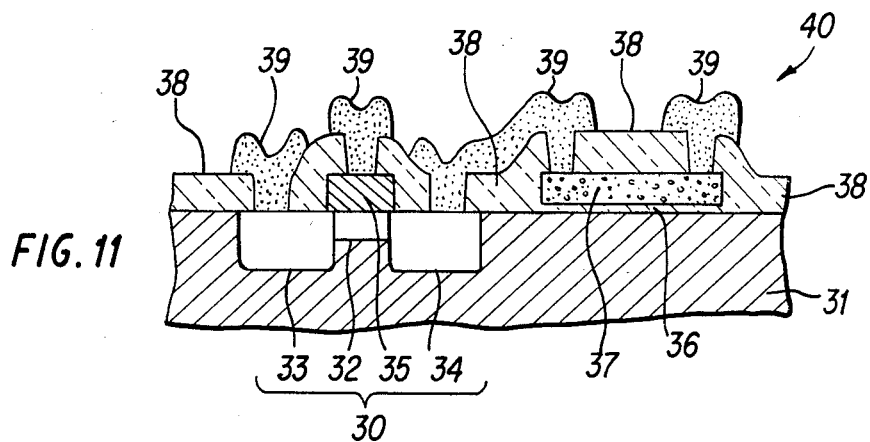
FIG. 11 is a cross-sectional view of an embodiment of Ga-As compound semiconductore IC having an FET and a resistor.
Figure 12:
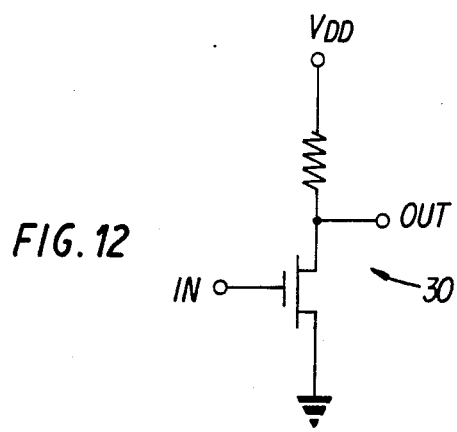
FIG. 12 is an equivalent circuit diagram of the Ga-As IC shown in FIG. 11.

FIG. 11 is a cross-sectional view of a gallium-arsenide (GaAs) compound semiconductor device, having a resistor of the present invention, and FIG. 12 is its equivalent circuit diagram. A field effect transistor 30 of a Shottky-barrier type, comprising a channel region 32, an n-type source region 33, an n-type drain region 34 and a gate electrode 35, is formed in a gallium-arsenide (GaAs) substrate 31. An input-signal is applied to the gate electrode 35 through a wiring 39 which is formed on an insulating layer 38. A thin film resistor 37 according to the present invention is formed as a load resistor over an insulating layer 36 covering the substrate 31 and connected to the drain region 34 and power source Vdd. The transistor in this embodiment is a transistor in the enhancement mode and has a gate electrode 2 $\mu$m long and 10 $\mu$m wide and its threshold voltage is approximately 0.15 V. The transconductance gm is approximately 130 mS/mm and the load resistance is 2800$\Omega$. The resistive layer in this embodiment is formed by a reactive sputtering method, where tungsten (W) and silicon (Si) are co-sputtered at the same time in the atmosphere of nitrogen ($N_2$) and argon (Ar). The atomic ratio of W:Si is from 1:1 to 1:0.6. The resistivity is lower than that of the preceding embodiment, being $10^{-1}$ to $10^{-3}$ $\Omega$cm for instance. Another sample was made by using the W:Si ratio=1:2 and nitrogen partial pressure of 0.75 to 0.67$\times 10^{-3}$ Torr. The resistivity of the resistor thus made varies 1 to 0.1 $\Omega$cm. The quantity of silicon nitride ($Si_3N_4$) contained is smaller than that of the preceding embodiments and the content of tungsten silicide ($W_5Si_3$) is greater than that of tungsten (W).

Especially, the thin film resistor containing tungsten (W) is suitable for fabrication of Ga-As compound semiconductor integared circuits because tungsten does not affect the device characteristics. In other words, tungsten does not react with Ga-As compounds even after annealing at 500° C. for two hours, whereas tantalum (Ta) easily diffuses into Ga-As at 425° C. annealing.

Additionally, a standardized Ga-As FET has tungsten silicide gates and a thin film resistor containing tungsten is formed by using the same sputtering apparatus including the predetermined nitrogen partial pressure. Therefore, a thin film resistor containing tungsten is feasible with the production of the gallium-arsenide IC.

The method or forming the resistors by this invention are not limited to a reactive sputtering method, but other conventional methods such as chemical vapor deposition (CVD) method, a reactive evaporation method utilizing an electron beam and a plasma ion reactive sputtering method are also applicable. The method by this invention is not limited to ICs but applicable to other discrete resistors such as a resistor network formed on a ceramic substrate and a discrete film resistor for hybrid circuits. One of the preferable applications of the resistor would be a thermal printer head in which the resistor or resistor array formed on a glazed ceramic substrate is used for means for necessary heat generation.

It is readily apparent that the above-described thin film resistor for an integrated circuit semiconductor device meets all of the objects mentioned above and also has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. A thin film resistor comprising:
   an insulative substrate; and
   a resistive thin film, formed on the surface of said insulative substrate, said resistive thin film comprising a mixture of silicon nitride ($Si_3N_4$) and metal particles, said metal particles being dispersed in said silicon nitride and said metal being selected from a group consisting of tungsten, molybdenum and their silicides.

2. A thin film resistor of claim 1, wherein said insulative substrate is a semiconductor substrate covered with an insulating layer, and at least a portion of said resistive thin film is formed on said insulating layer.

3. A thin film resistor of claim 2, wherein said semiconductor substrate further has a contact region on the surface thereof, and an opening formed in said insulating layer such that said contact region is exposed through said opening and a portion of said resistive thin film contacts the exposed surface of said contact region through said opening.

4. A thin film resistor of claim 2, wherein said insulative substrate is a ceramic.

5. A thin film resistor of claim 1, wherein said resistive thin film is a sputtered film having a resistivity of $10^{-3}$ to $10^9$ $\Omega$cm.

6. A thin film resistor of claim 1, wherein said metal is tungsten and an atomic ratio of silicon to tungsten is determinted by Si/W=3(1−x)/x wherein x equals 0.1 to 0.6, said resistor having a resistivity of 10 to $10^8$ $\Omega$cm.

7. A thin film resistor of claim 1, wherein said metal is molybdenum and an atomic ratio of silicon to molybdenum is determined by Si/Mo=3(1−x)/x wherein x equals 0.1 to 0.6, said resistor having a resistivity of 1 to $10^9$ $\Omega$cm.

8. A thin film resistor comprising an insulative substrate and a resistive thin film formed on said insulative substrate, said resistive thin film consisting of silicon nitride and tungsten silicide and having a resistivity of 1 to $10^{-3}$ $\Omega$cm.

9. A thin film resistor of claim 8, wherein said insulative substrate is a compound semiconductor covered with an insulating layer, and said resistive thin film is formed on said insulating layer.

* * * * *

UNITED STATES PATENT AND TRADEMARK OFFICE
CERTIFICATE OF CORRECTION

PATENT NO. : 4,609,903

DATED : September 2, 1986

INVENTOR(S) : Nobuo Toyokura et al.

It is certified that error appears in the above-identified patent and that said Letters Patent is hereby corrected as shown below:

Figure 3 should appear as shown below:

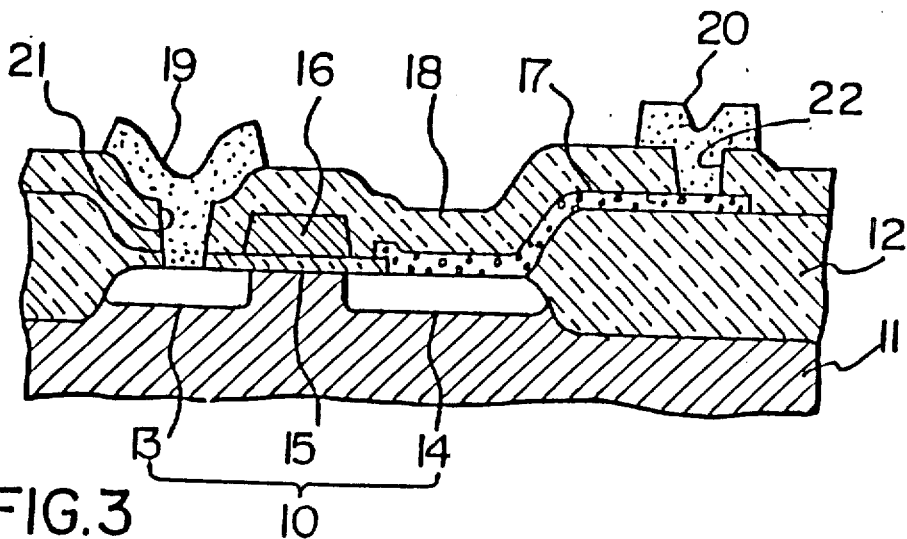

Signed and Sealed this

Seventeenth Day of February, 1987

*Attest:*

DONALD J. QUIGG

*Attesting Officer*     *Commissioner of Patents and Trademarks*